United States Patent
Jones

(10) Patent No.: US 9,246,288 B2
(45) Date of Patent: Jan. 26, 2016

(54) MULTIPURPOSE IN-VEHICLE DIAGNOSTIC II ADAPTER

(71) Applicant: Cability, Inc., San Jose, CA (US)

(72) Inventor: Allan Bailey Jones, San Jose, CA (US)

(73) Assignee: CABILITY, INC., San Jose, CA (US)

( * ) Notice: Subject to any disclaimer, the term of this patent is extended or adjusted under 35 U.S.C. 154(b) by 0 days.

(21) Appl. No.: 14/529,995

(22) Filed: Oct. 31, 2014

(65) Prior Publication Data

US 2015/0064972 A1 Mar. 5, 2015

Related U.S. Application Data

(62) Division of application No. 13/098,529, filed on May 2, 2011, now Pat. No. 8,903,597.

(60) Provisional application No. 61/329,657, filed on Apr. 30, 2010.

(51) Int. Cl.

| | |
|---|---|
| *G01M 17/00* | (2006.01) |
| *H01R 31/06* | (2006.01) |
| *G07C 5/00* | (2006.01) |
| *B60R 16/02* | (2006.01) |
| *B60R 16/023* | (2006.01) |
| *G07C 5/08* | (2006.01) |
| *G01R 31/00* | (2006.01) |
| *B60R 16/03* | (2006.01) |
| *G06F 19/00* | (2011.01) |

(52) U.S. Cl.
CPC .............. *H01R 31/065* (2013.01); *B60R 16/02* (2013.01); *B60R 16/023* (2013.01); *G07C 5/008* (2013.01); *G07C 5/0858* (2013.01); *H01R 31/06* (2013.01); *B60R 16/0315* (2013.01); *G01B 2210/26* (2013.01); *G01M 17/00* (2013.01); *G01R 31/007* (2013.01); *G06F 19/00* (2013.01); *G07C 5/00* (2013.01); *G07C 5/0808* (2013.01); *G07C 2205/02* (2013.01)

(58) Field of Classification Search
CPC .... G07C 2205/02; G07C 5/0858; G07C 5/00; G07C 5/008; G07C 5/0808; H01R 31/06; H01R 31/065; B60R 16/023; B60R 16/02; B60R 16/0315; G01M 17/00; G06F 19/00; G01B 2210/26; G01R 31/007
See application file for complete search history.

(56) References Cited

U.S. PATENT DOCUMENTS

| | | | | |
|---|---|---|---|---|
| 7,225,065 | B1 | 5/2007 | Hunt et al. | |
| 7,778,749 | B2 * | 8/2010 | McGee | H01R 31/065 701/33.2 |
| 8,340,861 | B2 * | 12/2012 | Lipscomb | G07C 5/0808 701/29.1 |
| 9,002,572 | B2 * | 4/2015 | Lipscomb | G07C 5/008 701/29.4 |
| 2006/0235586 | A1 * | 10/2006 | Waszkowski | G07C 5/0808 701/31.4 |
| 2010/0042288 | A1 * | 2/2010 | Lipscomb | G07C 5/0808 701/31.4 |

* cited by examiner

*Primary Examiner* — Behrang Badii
(74) *Attorney, Agent, or Firm* — GTC Law Group LLP & Affiliates

(57) ABSTRACT

The present invention is directed to an extension connector. The extension connector may include a first connector communicatively coupled to an in-vehicle connector associated with an automobile. The extension connector may further include a second connector that may be communicatively coupled to the first connector. The extension connector may further include a third connector that may be communicatively coupled to the first connector and the second connector.

7 Claims, 5 Drawing Sheets

500

PIN ASSIGNMENT

| P1 | P2 | P3 |
|----|----|----|
| 1 | 1 | 1 |
| 2 | 2 | 2 |
| 3 | 3 | 3 |
| 4 | 4 | 4 |
| 5 | 5 | 5 |
| 6 | 6 | 6 |
| 7 | 7 | 7 |
| 8 | 8 | 8 |
| 9 | 9 | 9 |
| 10 | 10 | 10 |
| 11 | 11 | 11 |
| 12 | 12 | 12 |
| 13 | 13 | 13 |
| 14 | 14 | 14 |
| 15 | 15 | 15 |
| 16 | 16 | 16 |

502

| P1 | P2 | P3 |
|----|----|----|
| A | A | A |
| B | B | B |
| C | C | C |
| D | D | D |
| E | E | E |
| F | F | F |
| G | G | G |
| H | H | H |
| J | J | J |

Fig. 5

MULTIPURPOSE IN-VEHICLE DIAGNOSTIC II ADAPTER

CROSS-REFERENCE TO RELATED APPLICATIONS

This application is a divisional application of U.S. patent application Ser. No. 13/098,529, filed May 2, 2011, of the same title, now U.S. Pat. No. 8,903,597; U.S. patent application Ser. No. 13/098,529 claims the benefit of U.S. provisional patent application Ser. No. 61/329,657 filed Apr. 30, 2010; both of these applications are incorporated by reference in their entirety.

BACKGROUND

1. Field

The present invention generally relates to electronic control unit interface features of land and water-based motor vehicles including, but not limited to, automobiles, commercial vehicles, and power boats. More specifically, the invention relates to On-Board Diagnostics of such vehicles.

2. Description of the Related Art

With the evolution of computers in the field of automobiles, On-Board Diagnostics (OBD) programs and interfaces were introduced to allow on-board and remotely coupled computers to help diagnose problems associated with automobiles. The initial instances of OBD simply allowed illumination of a malfunction indicator light (MIL) when a problem was detected. Such diagnostics were useful and several standards have been developed over the years, including the OBD-II J1962 and J1939 standards. These standards were developed by the Society of Automotive Engineers (SAE) and have become standard for all vehicles sold in the United States. The J1939 standard is a similar standard developed for commercial heavy duty on and off road, and marine applications. These specifications include a standardized hardware interface that defines the type of connector to be used and its specific pin-out, the electrical signaling protocols available, and the messaging format.

Further, the signals that are accessible from the J1962 or J1939 connectors include power supply, ground signal, and an in-vehicle standardized Controller Area Network (CAN) bus that pass a large amount of information throughout the vehicle. As such, these standard connectors make available information on a large number of car measurements, statuses, and error codes. In addition, the connectors may act as an input port for controlling certain parameters of the engine, ECUs, and other vehicle functions.

The OBD-II (J1962) and J1939 standards were primarily developed so that automobile mechanics could connect diagnostic scanners to access the information on the CAN bus to help diagnose and repair the vehicles' problem. While this function is immensely valuable to the automotive repair industry, the variables available through this connector may be used for many other real time vehicle applications. Accordingly, a number of specialized cables, constructed of commodity connectors interconnected by flexible cable (e.g. ribbon cable, wire bundles, and the like) have been built to connect devices other than diagnostic scanners to the diagnostic connector. For example, some providers of Global Positioning System (GPS) navigation units have developed specialized cable interfaces to connect to the diagnostic connector. Other applications of the diagnostic connector interface may include aftermarket real time tuning devices, vehicle location and theft prevention devices, and on-board entertainment and information systems. A limitation of such specialized cable interfaces is that they occupy the diagnostic connector so that if a diagnostic function needs to be performed on the vehicle or some other specialized use of the diagnostic port needs access, the original application must be disconnected.

An exemplary aftermarket device (available from supplier OBD2CABLES as part number 145802) partially reduced the discussed limitations by supplying a cable splitting function. This device connects to the original OBD-II connector and provides, through two cables, two standard OBD-II connectors. Presumably, one may then connect an application to one such cable and have the second such cable available for diagnostic scanning or in general a second application that needs the standard OBD-II output. A limitation of this approach is that the device comprises two flexible cables joined at one end to an OBD-II compatible connector with a connector at the end of each cable. Such a form factor compromises the benefits of a hard connector that is readily accessible and generally affixed under the dash close to the steering wheel. These flexible cables may entangle and create difficulties in maintaining the clean, simple look of the dashboard while potentially presenting a safety hazard. Additionally, the cost of this approach limits its usefulness and results in a bulky, expensive, and unwieldy device. A further limitation of this approach is that it only offers two identical standard OBD-II cable/connectors, yet in many applications, the full complement of OBD-II signals is unnecessary.

Another exemplary OBD-II device provides interface connections for diagnosis and testing purposes in vehicles. Such a device provides an integrated interface that facilitates an electrical connection to the Vehicle OBD connector while presenting individual banana style contacts for the OBD-II signals that is intended for temporary use, for example, to execute a test and monitor the testing process.

In accordance with the foregoing, there is a need in the art for a system, a method, and a computer product for providing a single integrated module that may provide a standard connector for allowing the flow of the standard diagnostic signals and an interface that may be customized for an application. Further, there is a need to provide an integrated module that may be permanently installed in a vehicle.

SUMMARY

The present invention is directed to a J1939 or J1962 extension and custom interface adapter. The OBD-II J1939 or J1962 extension and custom interface adapter may include a first connector for communicatively coupling to an in-vehicle diagnostic connector associated with an automobile. The J1939 or J1962 extension and custom interface adapter may further include a second connector that may be communicatively coupled to the first connector. The J1939 or J1962 extension and custom interface adapter may further include a third connector that may be communicatively coupled to the first connector and the second connector. The first, second, and third connectors may be housed in a housing that compactly integrates the three connectors. The first connector, the second connector and the third connector may respectively comprise a male J1962 or J1939 connector, a female J1962 or J1939 connector and a connector other than the J1962 or J1939 connector. Further, the pin out of the third connector may include a power signal, a ground signal and or a Controller Area Network (CAN) bus interface. The third connector may further comprise an output through a radio transceiver. The radio transceiver may be a Bluetooth facility.

In the methods and systems described herein, an in-vehicle diagnostic connector adapter may include a first connector for communicatively coupling to the in-vehicle diagnostic connector; a second connector communicatively coupled to the first connector, the second connector providing physical and electrical features that are substantially the same as the in-vehicle diagnostic connector; a third connector for facilitating access to a plurality of signals communicatively coupled between the first connector and the second connector; and a housing suitable for long-term in-vehicle use and for rigidly and compactly integrating the first, second, and third connectors, the second connector disposed to be accessible when the first connector is connected to the in-vehicle diagnostic connector. The first and second connectors are J1962 compatible connectors. The third connector comprises a sixteen terminal connector arranged as two parallel rows of eight terminals. The signals of the in-vehicle diagnostic connector are available on correspondingly numbered terminals of each of the first, second, and third connectors. The adapter may further include a processor integrated into the housing and communicatively coupled to a portion of the first connector signals to provide processed signals to the third connector. The portion of the processed signals conforms to signaling requirements that are different than those provided by the in-vehicle diagnostic connector. The processor enabled adapter may further include a wireless transceiver in communication with the processor to facilitate access to the in-vehicle diagnostic connector signals via one of Bluetooth, WiFi, WiMax, and LTE wireless communication. Alternatively, the third connector is disposed at substantially a right angle to the first connector. The first and second connectors are J1939 compatible connectors and the third connector comprises a nine terminal connector arranged as two parallel rows of terminals. Also, the signals of the in-vehicle diagnostic connector are available on correspondingly numbered terminals of each of the first, second, and third connectors.

The methods and systems described herein may include an in-vehicle diagnostic connector adapter that includes a first connector for communicatively coupling to the in-vehicle diagnostic connector; a second connector communicatively coupled to the first connector, the second connector providing physical and electrical features that are substantially the same as the in-vehicle diagnostic connector; a wireless communication port for facilitating wireless access to signals communicatively coupled between the first connector and the second connector; and a housing suitable for long-term in-vehicle use and for rigidly and compactly integrating the first and second connectors and the wireless communication port, the second connector disposed to be accessible when the first connector is connected to the in-vehicle diagnostic connector. The wireless communication port provides Bluetooth compatible wireless communication. Also, the first connector and the second connector conform to one of J1962 and J1939 connection requirements. The adapter may further include a third connector disposed to be accessible when the first connector is connected to the in-vehicle diagnostic connector and wherein signals of the in-vehicle diagnostic connector are available on correspondingly numbered terminals of each of the first, second, and third connectors. The third connector comprises a plurality of terminals disposed in two parallel rows. The adapter with a third connector may further include a processor communicatively coupled to a portion of the first connector signals to process signals through the third connector. The processed signals may conform to J1578 signaling requirements.

Alternatively in the methods and systems described herein, a method of in-vehicle diagnostic connector interfacing may include communicatively coupling a first connector that is compatible with the in-vehicle diagnostic connector to a second connector that includes physical and electrical features that are substantially the same as the in-vehicle diagnostic connector; enabling access through a third connector to a plurality of signals communicatively coupled between the first connector and the second connector while providing full access to each of the first and second connectors; and disposing the first, second, and third connectors in a housing that is suitable for long-term in-vehicle use and for rigidly and compactly integrating the first, second, and third connectors. In the method, the first connector and the second connector conform to one of J1962 and J1939 connection requirements.

These and other systems, methods, objects, features, and advantages of the present invention will be apparent to those skilled in the art from the following detailed description of the preferred embodiment and the drawings. All documents mentioned herein are hereby incorporated in their entirety by reference.

BRIEF DESCRIPTION OF THE FIGURES

The invention and the following detailed description of certain embodiments thereof may be understood by reference to the following figures:

FIG. 5 depicts tables of pin assignments for three interfaces of the OBD-II and the J1939 extension and custom interface adapter.

DETAILED DESCRIPTION

Detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting, but rather to provide an understandable description of the invention.

The terms "a" or "an," as used herein, are defined as one or more than one. The term "another," as used herein, is defined as at least a second or more. The terms "including" and/or "having", as used herein, are defined as comprising (i.e., open transition). The term "coupled" or "operatively coupled," as used herein, is defined as connected, although not necessarily directly and not necessarily mechanically.

Figure 1:
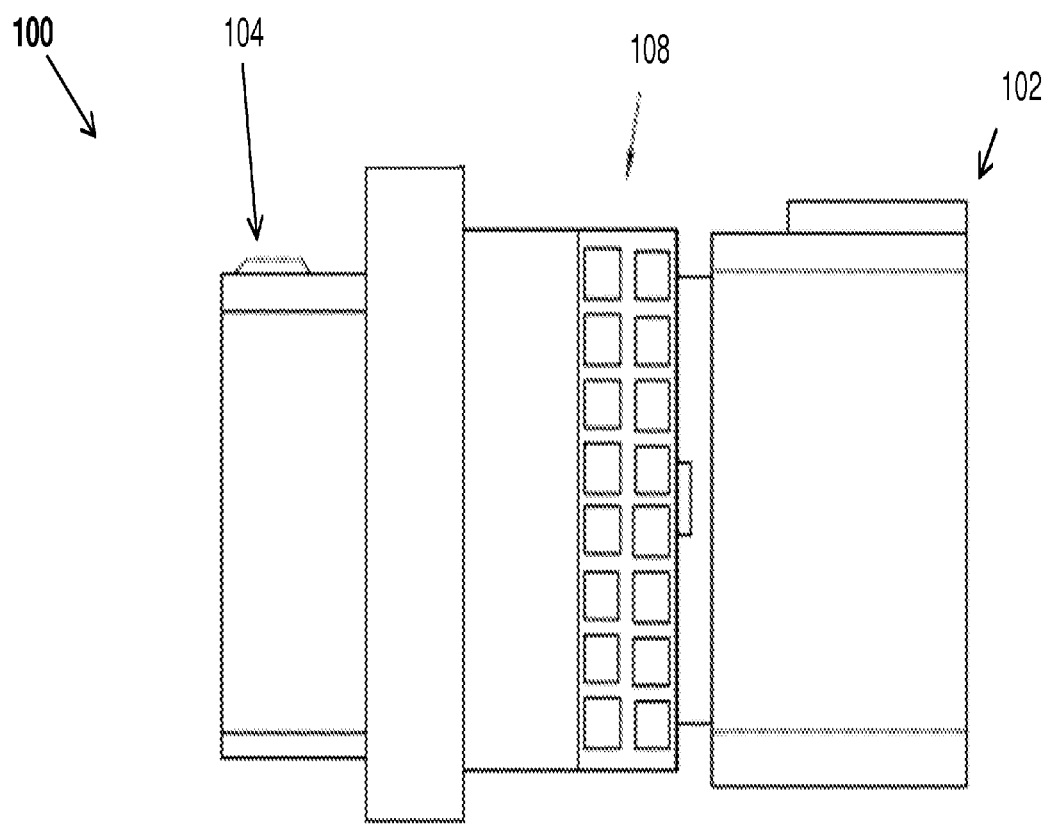
FIG. 1 depicts a top view of an On-Board Diagnostics-II (OBD-II) extension and custom interface adapter.

Referring now to FIG. 1, which depicts a view of an On-Board Diagnostics-II (OBD-II) extension and custom interface adapter 100 (hereafter referred as adapter 100) may be a single integrated facility with multiple interfaces. In an embodiment of the invention, the adapter 100 may be an OBD-II extension connector with three types of connectors. Further, in embodiments of the invention, the three types of connectors may include an OBD-II plug 102, an OBD-II receptacle 104, and a custom interface 108. The third connector such as the custom interface 108 may include a connector other than a J1962 connector. The shape, size, appearance, pin-out, and function of a connector associated with the custom interface 108 may be adapted to provide OBD-II interface signals so that they conform with application-specific requirements of a device which will be connected to the interface 108. In an embodiment, the adapter 100 may inculde a wireless communication interface that may support any of a variety of wireless protocols including, without limitation, Bluetooth and the like.

Further, in embodiments of the invention, the OBD-II plug 102 may be communicatively coupled to an in-vehicle OBD-II compliant J1962 receptacle. The OBD-II plug 102 may pass the J1962 signals to the communicatively coupled OBD-II receptacle 104. The OBD-II receptacle 104 may provide an interface that is electrically and physically identical to an in-vehicle OBD-II receptacle per SAE J1962 standards. The custom interface 108 may be communicatively coupled to predefined signal lines between the OBD-II plug 102 and the OBD-II receptacle 104.

Figure 2:
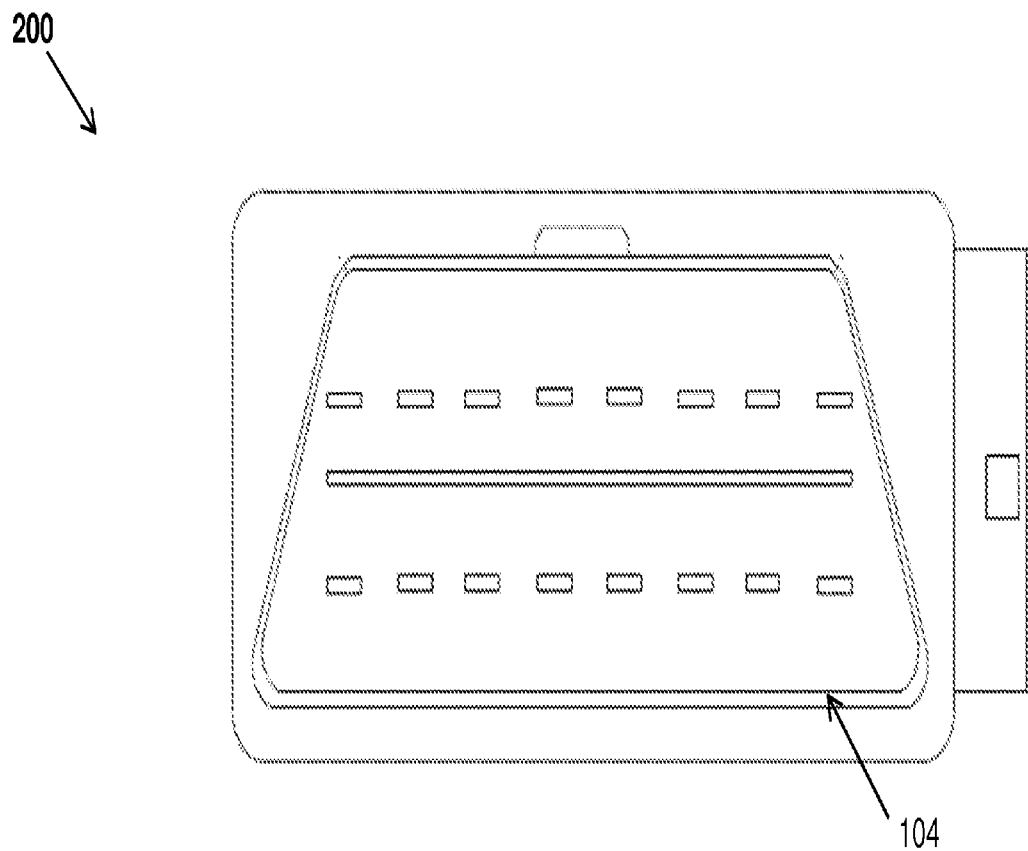
FIG. 2 depicts a front view a connector of the embodiment of FIG. 1.

Referring to FIG. 2, a front view of an OBD-II extension and custom interface adapter 200 is depicted. The front view illustrates the OBD-II receptacle 104 that may be plugged into an OBD-II connector in a vehicle.

Figure 3:
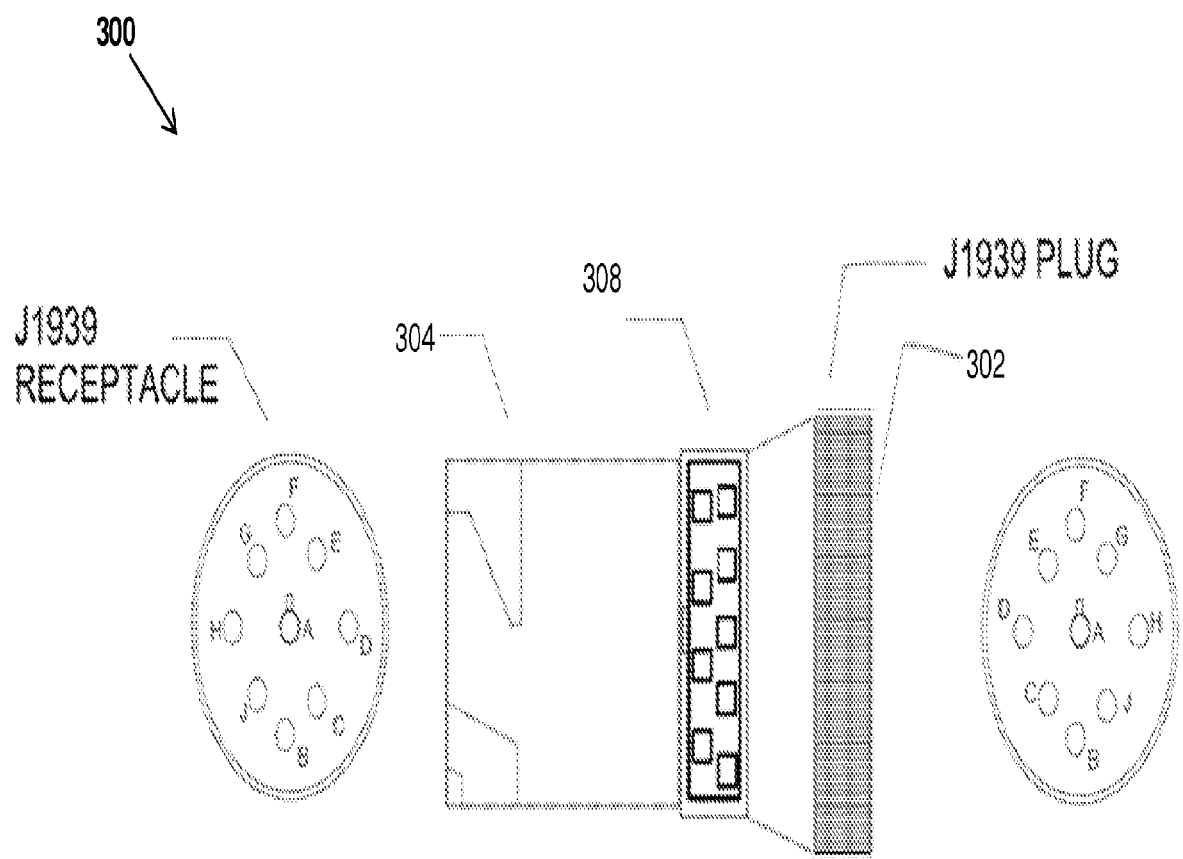
FIG. 3 depicts left, top, and right views of a J1939 extension and custom interface adapter.

Referring to FIG. 3, a left, top, and right view of the J1939 embodiment of the extension and custom interface adapter 300 for connection using the J1939 communication functions is illustrated. In an embodiment, the adapter 300 may be communicatively coupled to a J1939 compatible device, such as a GPS module, a hand-held device, antitheft device, and the like. The J1939 adapter 300 may be used with commercial vehicles, such as tractors/trailers, military trucks, cement mixers, and the like. The J1939 standard has an application layer to enable communication between the engine control, transmission control, vehicle body control, and the specially designed sub-control systems. The application layer may define specific data contained within each message sent across the network. A physical layer of the J1939 standard describes an electrical interface to a bus. Further, a data link layer may describe various rules for constructing a message, accessing the bus, and detecting transmission errors.

In an embodiment of the invention, the adapter 300 may be an J1939 extension connector with three types of connectors. In embodiments of the invention, the three types of connectors may include a J1939 plug 302, a J1939 receptacle 304, and a J1939 custom interface 308. The custom interface 308 may include a connector other than a J1939 connector.

The J1939 plug 302 may be connected to a J1939 receptacle 304. The J1939 plug 302 may pass the J1939 signals to the communicatively coupled J1939 receptacle 304. The J1939 receptacle 304 may provide an interface that may be electrically and physically identical to an in-vehicle receptacle per SAE J1939 standards. Further, the custom interface 308 may be communicatively coupled to the predefined signal lines between the J1939 plug 302 and the J1939 receptacle 304.

In an embodiment of the invention, the custom interface 108/308 may include, without any limitation, any one or more of a power signal, a ground signal, a Controller Area Network (CAN) bus interface, and the like. In yet another embodiment of the invention, the adapter 100/300 may include a processor-enabled radio transceiver that may facilitate receiving any signal carried in the J1962 or J1939 specification to/from a vehicle to which the adapter 100/300 is attached. Such a radio transmitter may also facilitate controlling vehicle operation, such as through the CAN interface protocol by allowing the wireless transmission of data, commands, instructions, and the like to the processor-enabled radio transceiver for further communication to the vehicle through the adapter 100/300. In an example, the processor-enabled radio transceiver may support a Bluetooth communication protocol. Alternatively, the custom interface 108/308 may be configured to support the electrical and physical connection of a Bluetooth compatible module for facilitating the wireless communication to the vehicle.

In embodiments, standards other than J1939 and J1962 may be equally applied to the adapter and its components for land and water-based motor vehicles including, but not limited to, automobiles, commercial vehicles, marine vessels, and power vehicles. For example, the SAE J1708 standard may be used in conjunction with heavy duty vehicles such as trucks, buses, and the like. The SAE J1708 standard may enable serial communication between modules with microcontrollers. Further, the SAE J1708 standard may allow signals to be transferred between devices in a more cost-effective way. The SAE J1708 standard may minimize hardware costs and may offer flexibility and possibility of further expanding the system.

In another example, the SAE J1587 standard may also be used for such vehicles. The SAE J1587 standard specifies the message formats and messages for general information on a vehicle bus and diagnostics. SAE J1708 may provide the physical and data link layers while SAE J1587 may provide the transport and application layers with respect to an OSI model. SAE J1587 may be used in conjunction with SAE J1708 for automobile communication. J1939 is similar to J1708 and J1587 standards; however, J1939 is built on CAN. To facilitate use of the adapter 100/300 with the J1708/J1587 and other standards, the signals that pass through the custom interface 108/308 may be processed and adapted internally by electronics within the adapter 100/300 to support a plurality of interfaces with the same physical adapter 100/300.

Embodiments of the present invention may be useful in a wide range of vehicles. Examples of such vehicles may include automobiles and trucks as well as commercial equipment, heavy-duty trucks, marine applications, industrial vehicles such as tractors, construction vehicles (e.g., front-end loaders, bulldozers, forklifts), and the like. The heavy-duty trucks may operate using a communication protocol such as J1939 that may collect diagnostic information from sensors distributed in the truck, process this information, and make it available through a heavy-duty vehicle diagnostic port. The heavy-duty vehicle diagnostic port may be accessed through the 9 pin connector of the adapter 300 that may be located in the truck's interiors such as under the dashboard or steering wheel. The heavy-duty vehicle diagnostic port may be interchangeably referred as a diagnostic port.

Figure 4:
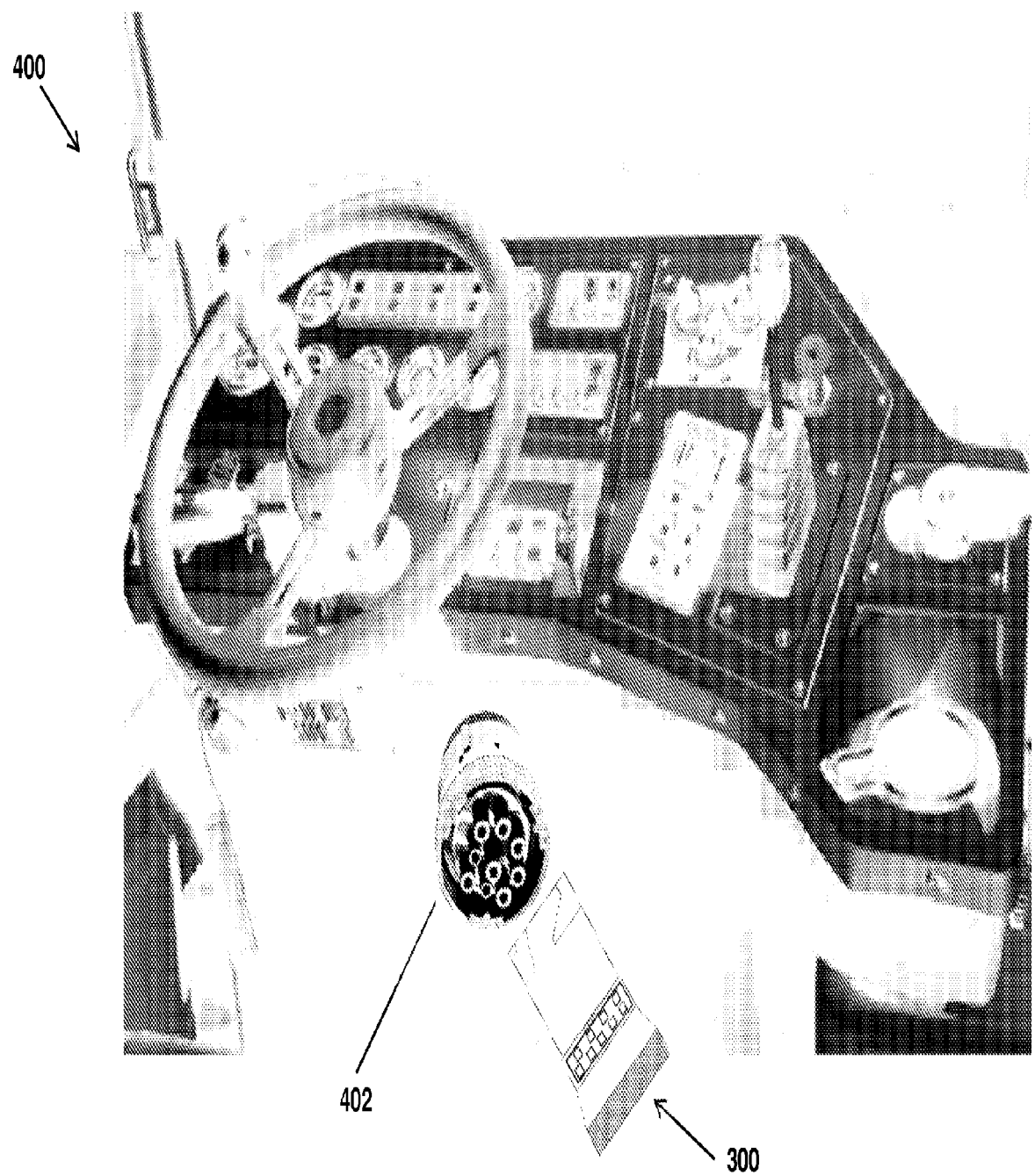
FIG. 4 depicts the J1939 extension and custom interface adapter installed in a vehicle.

Now, referring to FIG. 4, an application of the adapter 300 in a vehicle is depicted. The vehicle may include any heavy-duty vehicle such as a truck, a tractor, and the like. The J1939 plug 302 of the adapter 300 may be plugged into the J1939 diagnostic port 402 of the heavy-duty vehicle. This may facilitate the exchange of the CAN signals between the heavy-duty vehicle and the adapter 300. In an embodiment, the adapter 300 may have the functionality of a standard connector such as a Data Link Connector (DLC). A DLC may provide a standard way of communicating with the vehicle's computer, also known as an Electronic Control Unit (ECU). Further, the adapter 300 may enable simultaneous connection of third-party devices with the heavy-duty vehicle. This may facilitate the third-party devices to simultaneously communicate with the heavy-duty vehicle. For example, the custom interface 308 of the adapter 300 may enable a user to connect a plurality of devices, such as Global Positioning System (GPS) modules, vehicle location and theft prevention devices, and the like, to the adapter 300, without disrupting the connection between the adapter 300 and the heavy-duty vehicle.

In an embodiment, the adapter 300 may be installed permanently in the heavy-duty vehicle. Accordingly, the adapter 300 may remain in place during the normal operation of the vehicle. In another embodiment, the adapter 300 may be detachable and hence, installed semi-permanently in the heavy-duty vehicle. Further, the adapter 300 may offer a rigid form factor since the adapter 300 is fixed to the vehicle without the need of cables, which used to cause entanglement and result in untidiness of the vehicle.

Referring to FIG. 5 which depicts tables of pin assignments for three interfaces of the extension and custom interface adapter 100/300, all three interfaces: P1=102/302, P2=104/304, and P3=108/308 may provide access to all of the connector signals referenced by the J1962/J1939 specification. Table 500 lists the pin outs for adapter 100 and table 502 list the pin outs for adapter 300.

The present invention may enable a smaller, more compact and less expensive unit and may offer customized, low cost and efficient connection to a vehicle electronic information and diagnostic interface for any of a plurality of applications as described herein and elsewhere.

The present invention provides a single integrated module that may provide a standard connector that allows the flow of standard diagnostic signals and an interface that may be customized for an application. Further, it may be evident to a person skilled in the art that the standards other than J1962 and J1939 may be applicable to various embodiments of the invention.

While the invention has been disclosed in connection with the preferred embodiments shown and described in detail, various modifications and improvements thereon will become readily apparent to those skilled in the art. Accordingly, the spirit and scope of the present invention is not to be limited by the foregoing examples, but is to be understood in the broadest sense allowable by law.

All documents referenced herein are hereby incorporated by reference.

What is claimed is:

1. An in-vehicle diagnostic connector adapter comprising:
   a first connector for communicatively coupling to the in-vehicle diagnostic connector;
   a second connector communicatively coupled to the first connector, the second connector providing physical and electrical features that are substantially the same as the in-vehicle diagnostic connector;
   a wireless communication port for facilitating wireless access to signals communicatively coupled between the first connector and the second connector; and
   a housing suitable for long-term in-vehicle use and for rigidly and compactly integrating the first and second connectors and the wireless communication port, the second connector disposed to be accessible when the first connector is connected to the in-vehicle diagnostic connector.

2. The adapter of claim 1, wherein the wireless communication port provides Bluetooth compatible wireless communication.

3. The adapter of claim 1, wherein the first connector and the second connector conform to one of J1962 and J1939 connection requirements.

4. The adapter of claim 1, further including a third connector disposed to be accessible when the first connector is connected to the in-vehicle diagnostic connector and wherein signals from the in-vehicle diagnostic connector are available on correspondingly numbered terminals of each of the first, second, and third connectors.

5. The adapter of claim 4, wherein the third connector comprises a plurality of terminals disposed in two parallel rows.

6. The adapter of claim 4, further including a processor communicatively coupled to a portion of terminals of the first connector to process signals through the third connector.

7. The adapter of claim 6, wherein the processed signals conform to J1578 signaling requirements.

* * * * *